(12) United States Patent
Jang et al.

(10) Patent No.: US 12,302,732 B2
(45) Date of Patent: May 13, 2025

(54) COLOR FILTER STRUCTURE USING QUANTUM DOTS AND DISPLAY DEVICE

(71) Applicant: LG DISPLAY CO., LTD., Seoul (KR)

(72) Inventors: Kyungkook Jang, Goyang-si (KR); Seungryong Lee, Paju-si (KR); Wonrae Kim, Paju-si (KR); Seungcheol You, Seoul (KR); Dabin Kim, Changwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 505 days.

(21) Appl. No.: 17/518,147

(22) Filed: Nov. 3, 2021

(65) Prior Publication Data

US 2022/0199692 A1 Jun. 23, 2022

(30) Foreign Application Priority Data

Dec. 18, 2020 (KR) .................. 10-2020-0178478

(51) Int. Cl.
| | |
|---|---|
| *H10K 59/38* | (2023.01) |
| *C09K 11/88* | (2006.01) |
| *G02B 5/20* | (2006.01) |
| *H01L 27/15* | (2006.01) |
| *H01L 33/50* | (2010.01) |

(Continued)

(52) U.S. Cl.
CPC ............ *H10K 59/38* (2023.02); *C09K 11/883* (2013.01); *G02B 5/201* (2013.01); *H01L 27/156* (2013.01); *H01L 33/502* (2013.01); *H10K 50/854* (2023.02); *H10K 59/12* (2023.02); *H01L 2933/0091* (2013.01)

(58) Field of Classification Search
CPC .... H10K 59/38; H10K 50/854; C09K 11/883; H01L 27/156; H01L 33/502; G02B 5/206; G02B 5/207; G02B 5/22
See application file for complete search history.

(56) References Cited

U.S. PATENT DOCUMENTS

| | | | |
|---|---|---|---|
| 2006/0263593 A1* | 11/2006 | Aziz | .................. H10K 59/8792 |
| | | | 313/506 |
| 2020/0194502 A1* | 6/2020 | Joo | ........................ H10K 50/86 |
| 2020/0258946 A1* | 8/2020 | Kim | ..................... H10K 50/115 |

(Continued)

FOREIGN PATENT DOCUMENTS

| | | |
|---|---|---|
| JP | 2009-205029 A | 9/2009 |
| KR | 10-2013-0000506 A | 1/2013 |

(Continued)

*Primary Examiner* — Lex H Malsawma
*Assistant Examiner* — Bruce R. Smith
(74) *Attorney, Agent, or Firm* — Birch, Stewart, Kolasch & Birch, LLP

(57) ABSTRACT

Discussed is a color filter structure for converting a wavelength of light emitted from a light-emissive element. The color filter structure includes a light-conversion layer containing a first resin and quantum dots dispersed in the first resin, wherein each quantum dot has a core/shell structure. The color filter structure further includes a light-absorbing layer stacked on the light-conversion layer, wherein the light-absorbing layer contains a second resin and semiconductor nano-particles dispersed in the second resin. The semiconductor nano-particles absorb light emitted from the light-emissive element. Accordingly, the color filter structure improves color purity and luminance of the emitted light.

15 Claims, 15 Drawing Sheets

(51) Int. Cl.
*H10K 50/854* (2023.01)
*H10K 59/12* (2023.01)

(56) References Cited

U.S. PATENT DOCUMENTS

2020/0332186 A1* 10/2020 Kim ................. C09K 11/02
2021/0074770 A1* 3/2021 Choe ................ G02B 5/0242
2022/0376214 A1* 11/2022 He .................. H10K 50/865

FOREIGN PATENT DOCUMENTS

KR  10-2016-0084794 A  7/2016
KR  10-2020-0097373 A  8/2020

* cited by examiner

COLOR FILTER STRUCTURE USING QUANTUM DOTS AND DISPLAY DEVICE

CROSS-REFERENCE TO RELATED APPLICATION

This application claims a priority benefit under 35 U.S.C. § 119(a) to Korean Patent Application No. 10-2020-0178478 filed on Dec. 18, 2020, in the Korean Intellectual Property Office, the entire contents of which are hereby expressly incorporated by reference for all purposes into the present application.

BACKGROUND

Field

The present disclosure relates to a color filter structure and a display device, and, more specifically, to a color filter structure using quantum dots and a display device including the color filter structure.

Description of Related Art

Flat-panel display devices that are thin, light and advantageous in implementing a large area include liquid crystal display devices (LCD), organic light-emitting display devices (OLED), and so on. Recently, a flat panel display device in which an inorganic light-emitting diode (LED) having a size of smaller than 100 μm is applied to a pixel has also been proposed.

In a driving method of these display devices, light-emitting elements that emit red, green, and blue light beams are formed in red, green, and blue sub-pixels, respectively, to emit red, green, and blue light beams, individually. Alternatively, different color filters are applied into red, green, or blue sub-pixels, and light generated from a light source passes through the color filters to implement light beams of colors corresponding to the sub-pixels.

When light generated from the light source passes through the color filter, the color filter absorbs light, such that a loss of some emitted light is inevitable, and a full width half maximum (FWHM) of the finally emitted light can be larger, so that the color purity may be low. Recently, a scheme using quantum dots with color filters has been proposed to improve the color purity of the emitted light.

SUMMARY OF THE DISCLOSURE

When using a light source for generating blue light and a light-conversion layer including red quantum dots or green quantum dots, a portion of blue light that may not be converted by the light-conversion layer passes through the light-conversion layer. Thus, in order to obtain red light or green light with the high color purity, it is necessary for the color filter to absorb the blue light that has passed through the light-conversion layer. Since light transmittance of the color filter can be about 80%, the red light or green light converted by the light-conversion layer may be lost by the color filter, such that the luminance of the emitted light may be deteriorated.

Further, there is a case of introducing a low refractive index layer between the color filter and the light-conversion layer in order to reuse the light that passes through the light-conversion layer. In this case, the light-conversion efficiency using the light-conversion layer can increase, whereas improvement of the luminance of the emitted light may be limited because a portion of the converted light (red light or green light) is totally reflected from an interface between the light-conversion layer and the low refractive index layer.

Accordingly, the inventors of the present disclosure have invented a color filter structure that can improve both of the color purity and the luminance of the emitted light, which will be described below in more detail. Moreover, the inventors of the present disclosure have invented a display device in which this color filter structure is applied to sub-pixels, which will be described below in more detail.

A purpose to be achieved according to one embodiment of the present disclosure is to provide a color filter structure capable of improving both of the color purity and luminance of the emitted light, and a display device having high luminance and high color purity and including the same.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

One embodiment of the present disclosure provides a color filter structure that converts a wavelength of light emitted from a light-emissive element. The color filter structure includes a light-conversion layer including a first resin and quantum dots of a core/shell structure dispersed in the first resin, and a light-absorbing layer stacked on the light-conversion layer. The light-absorbing layer includes a second resin and semiconductor nano-particles that are dispersed in the second resin and absorb light emitted from the light-emissive element.

Accordingly, the color filter structure according to the present disclosure can improve both of the color purity and the luminance of emitted light.

A display device according to one embodiment of the present disclosure includes an array substrate including light-emissive elements respectively arranged in a red sub-pixel area, a green sub-pixel area, and a blue sub-pixel area, and a color filer layer including a red color filter structure disposed in a red sub-pixel area of the array substrate, and a green color filter structure disposed in the green sub-pixel area of the array substrate.

In this connection, the red color filter structure includes a red light-conversion layer composed of a first resin in which red quantum dots are dispersed, and a first light-absorbing layer disposed on the red light-conversion layer and composed of a second resin in which semiconductor nano-particles for absorbing light emitted from the light-emissive elements are dispersed. The green color filter structure include a green light-conversion layer composed of a first resin in which green quantum dots are dispersed, and a second light-absorbing layer disposed on the green light-conversion layer and composed of a second resin in which semiconductor nano-particles for absorbing light emitted from the light-emissive elements are dispersed.

Accordingly, the display device according to the present disclosure can provide both of high luminance and high color purity.

In the color filter structure according to the present disclosure, the light-absorbing layer including semiconductor nano-particles that absorb light emitted from the light-emissive element is disposed on the light-conversion layer including quantum dots, thereby improving both of the color purity and the luminance of the emitted light.

In the color filter structure according to the present disclosure, the second resin having the same refractive index as that of the first resin of the light-conversion layer is applied to the light-absorbing layer, such that total reflection from an interface between the light-conversion layer and the light-absorbing layer can be prevented and the luminance of the emitted light can be improved.

In the display device according to the present disclosure, the red color filter structure including the red light-conversion layer including red quantum dots and the first light-absorbing layer including the semiconductor nano-particles that absorb light emitted from the light-emissive element can be disposed on the red sub-pixel of the array substrate. The green color filter structure including the green light-conversion layer including green quantum dots and the second light-absorbing layer including semiconductor nano-particles that absorb light emitted from the light-emissive element can be disposed on the green sub-pixel of the array substrate. Thus, both of the high color purity and high color purity can be implemented by the device.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
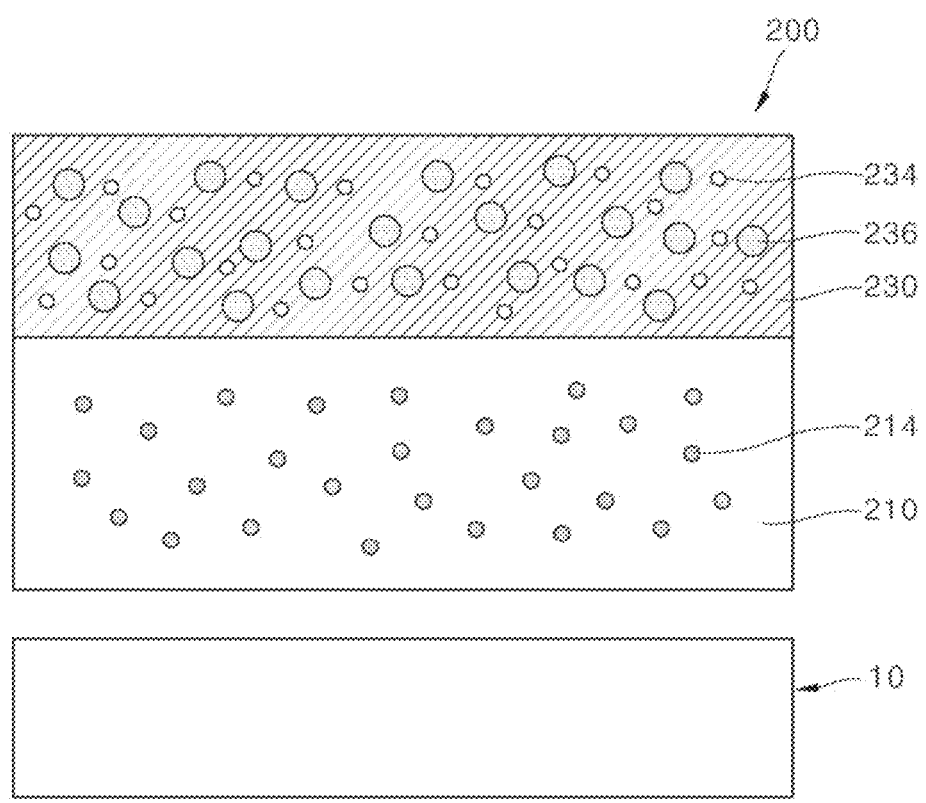
FIG. 1 is a cross-sectional view showing a color filter structure according to one embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a color filter structure and a display device including the color filter structure according to embodiments of the present disclosure will be described. All the components of each color filter structure and each display device including the color filter structure according to all embodiments of the present disclosure are operatively coupled and configured.

FIG. 1 is a cross-sectional view showing a color filter structure according to one embodiment of the present disclosure.

Referring to FIG. 1, a color filter structure 200 according to one embodiment of the present disclosure which converts a wavelength of light emitted from a light-emissive element 10 as a light source includes a light-conversion layer 210 including a first resin, and quantum dots 214 of a core/shell structure dispersed in the first resin, and a light-absorbing layer 230 stacked on the light-conversion layer 210. The light-absorbing layer 230 includes a second resin and semiconductor nano-particles 234 that are dispersed in the second resin to absorb light emitted from the light-emissive element. In other words, the light-conversion layer 210 can be composed of the first resin in which the quantum dots 214 of the core/shell structure are dispersed. The light-absorbing layer 230 stacked on the light-conversion layer 210 can be composed of the second resin in which the semiconductor nano-particles 234 that absorb light emitted from the light-emissive element are dispersed.

For each quantum dot 214, the quantum dot 214 can emit light of a wavelength varying depending on a size thereof. A typical size of the quantum dot can be 1 to 10 nm. When the size of the quantum dot (QD) is 4 to 5 nm, the QD absorbs light (e.g., blue light) emitted from the light-emissive element 10 as a light source and then emits red light. When the size of the QD is 2 to 3 nm, the QD can absorb light (e.g., blue light) emitted from the light-emissive element 10 and emit green light.

For each quantum dot 214, the quantum dot 214 has a core/shell structure such as having a core and one or more shells. The shell can be a single shell or multiple shells. The quantum dot can be made of a group II-VI compound semiconductor, a group III-V compound semiconductor, a group IV-VI compound semiconductor, a group IV single or compound semiconductor, or a combination thereof.

As an example, the II-VI compound semiconductor can include a binary compound selected from a group consisting of CdSe, CdTe, ZnS, ZnSe, ZnTe, ZnO, HgS, HgSe, HgTe, MgSe, MgS, and mixtures thereof, a ternary compound selected from a group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and/or a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

As an example, the III-V group compound semiconductor can include a binary compound selected from a group consisting of a binary compound selected from a group consisting of GaN, GaP, GaAs, GaSb, AlN, AlP, AlAs, AlSb, InN, InP, InAs, InSb and mixtures thereof; a ternary compound selected from a group consisting of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof, and/or a quaternary compound selected from a group consisting of GaAlNP, GaAlNAs, GaAlNSb, GaAl- PAs, GaAlPSb, GaInNP, GaInNAs, GaInNSb, GaInPAs, GaInPSb, InAlNP, InAlNAs, InAlNSb, InAlPAs, InAlPSb and mixtures thereof.

As an example, the IV-VI group compound semiconductor can include a binary compound selected from a group consisting of SnS, SnSe, SnTe, PbS, PbSe, PbTe, and mixtures thereof, a ternary compound selected from a group consisting of SnSeS, SnSeTe, SnSTe, PbSeS, PbSeTe, PbSTe, SnPbS, SnPbSe, SnPbTe, and mixtures thereof, and/or a quaternary compound selected from a group consisting of SnPbSSe, SnPbSeTe, SnPbSTe, and mixtures thereof.

For example, the quantum dot 214 can have an InP (core)/ZnSe (primary shell)/ZnS (secondary shell) structure. The quantum dot 214 can be, for example, a green quantum dot that emits green light or a red quantum dot that emits red light.

The semiconductor nano-particles 234 according to the present disclosure absorbs light for example, blue light emitted from the light-emissive element 10 as a light source, but does not exhibit photoluminescence characteristics. The characteristics of the semiconductor nano-particles 234 will be described with reference to FIGS. 9 and 10 below.

A size of each of the semiconductor nano-particles 234 can be 1 to 10 nm. For example, the size thereof can be 5 to 7 nm.

Each of the semiconductor nano-particles 234 can be made of a group II-VI compound semiconductor or a group III-V compound semiconductor.

As an example, the II-VI compound semiconductor can include a binary compound selected from a group consisting of CdSe, CdTe, ZnS, ZnSe, ZnTe, ZnO, HgS, HgSe, HgTe, MgSe, MgS, and mixtures thereof a ternary compound selected from a group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof and/or a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

As an example, the III-V group compound semiconductor can include a binary compound selected from a group consisting of GaN, GaP, GaAs, GaSb, AlN, AlP, AlAs, AlSb, InN, InP, InAs, InSb and mixtures thereof a ternary compound selected from a group consisting of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof and/or a quaternary compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

When the light emitted from the light-emissive element 10 is for example, blue light, the semiconductor nano-particles 234 can be made of, for example, $ZnSe_xTe_{1-x}$ (x is 0.72 to 0.9).

The color filter structure 200 according to one embodiment of the present disclosure includes the light-absorbing layer 230 including the semiconductor nano-particles 234 that absorb light emitted from the light-emissive element 10, for example, blue light, but do not exhibit photoluminescence characteristics. Thus, light transmitting through the light-conversion layer 210 while not being converted by the light-conversion layer 210 can be absorbed by the light-absorbing layer 230. Accordingly, the color filter structure 200 can allow the light converted by the light-conversion layer 210 to have improved color purity.

The light-conversion layer 210 and the light-absorbing layer 230 can have the same refractive index. The first resin of the light-conversion layer 210 and the second resin of the light-absorbing layer 230 can have the same refractive index. For example, the first resin of the light-conversion layer 210 and the second resin of the light-absorbing layer 230 can be made of the same material. The first resin of the light-conversion layer 210 and the second resin of the light-absorbing layer 230 can be acrylic or epoxy resin. While the refractive indexes of the first resin of the light-conversion layer 210 and the second resin of the light-absorbing layer 230 are the same, the refractive indexes and the contents of the particles in the light-conversion layer 210 and the light-absorbing layer 230 can be adjusted such that the light-conversion layer 210 and the light-absorbing layer 230 can have the same refractive index.

Thus, refraction and total reflection of light do not occur at a boundary between the light-conversion layer 210 and the light-absorbing layer 230. Thus, the light converted by the quantum dot 214 of the light-conversion layer 210 can be transferred to the light-absorbing layer 230 without loss and can be finally released to an outside. Accordingly, luminance of light (for example, red or green light) of a color to be implemented through the color filter structure 200 can be improved.

The quantum dot 214 and the semiconductor nano-particle 234 can have similar refractive indices.

The light-absorbing layer 230 can further include scattering-particles 236 dispersed in the second resin. In other words, the light-absorbing layer 230 can be composed of the second resin in which the semiconductor nano-particles 234 absorbing the light emitted from the light-emissive element, and the scattering-particles 236 are dispersed. The scattering-particles 236 can be made of at least one selected from a group consisting of for example, $TiO_2$, ZnO, $ZrO_2$, and the like.

Moreover, the light-absorbing layer 230 includes the scattering-particles 236 that scatter light. Thus, the total reflection at a surface of the light-absorbing layer 230 can be reduced, so that the light extraction efficiency to the outside can be improved. Therefore, luminance of light (for example, red light, or green light) of a color to be implemented through the color filter structure 200 can be further improved.

Figure 16:
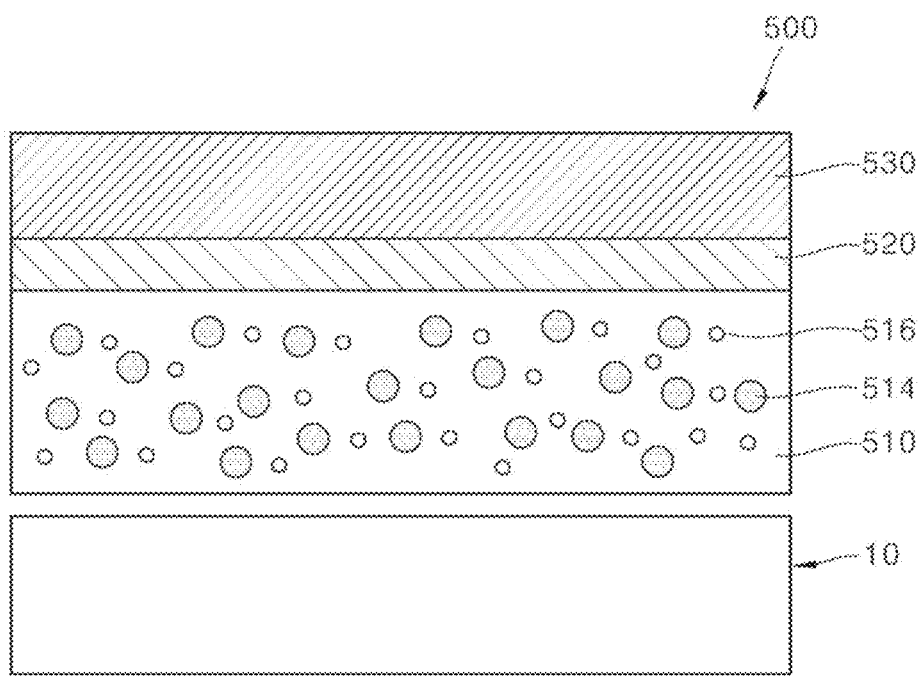
FIG. 16 is a cross-sectional view showing a color filter structure according to a comparative example.

Moreover, unlike a comparative example in FIG. 16 in which the scattering-particles are contained in the light-conversion layer 210, the scattering-particles are included in the light-absorbing layer 230 in FIG. 1. Thus, a larger number of quantum dots can be contained in the light-conversion layer 210, compared to the comparative example, while maintaining coating characteristics required when using an inkjet scheme. Therefore, the light-conversion efficiency of the light-conversion layer 210 can be improved.

Figure 9:
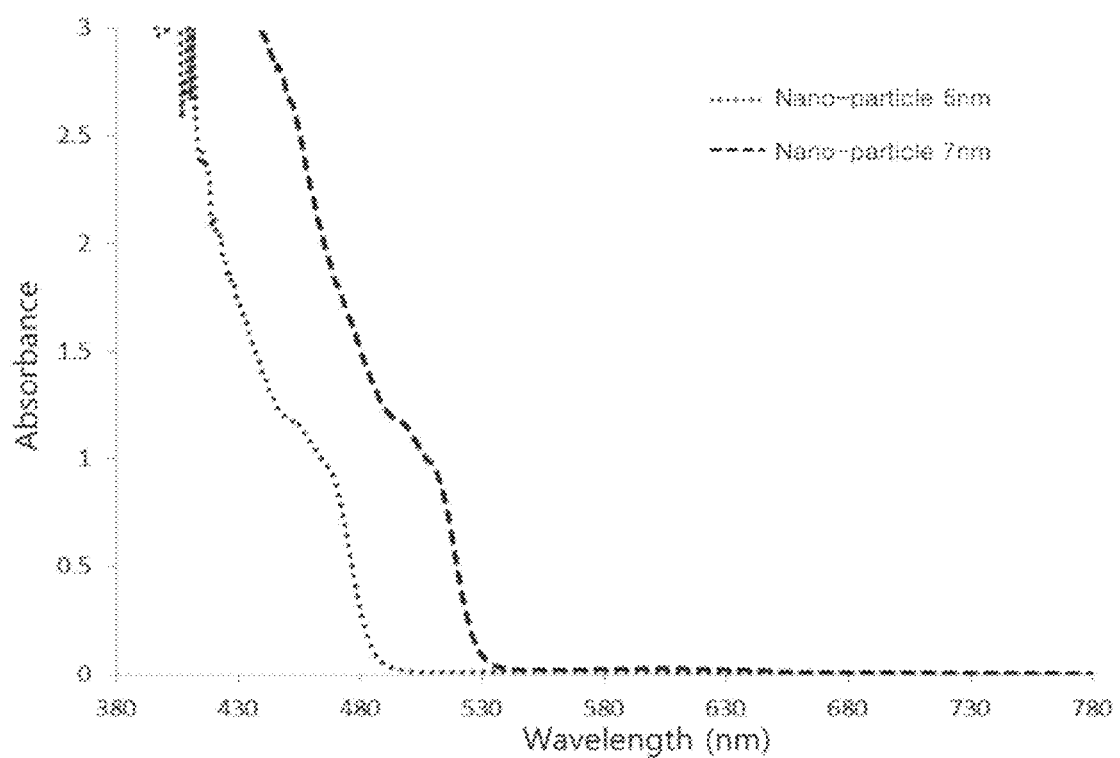
FIG. 9 shows an absorption spectrum of nano-particles according to one embodiment of the present disclosure.
Figure 10:
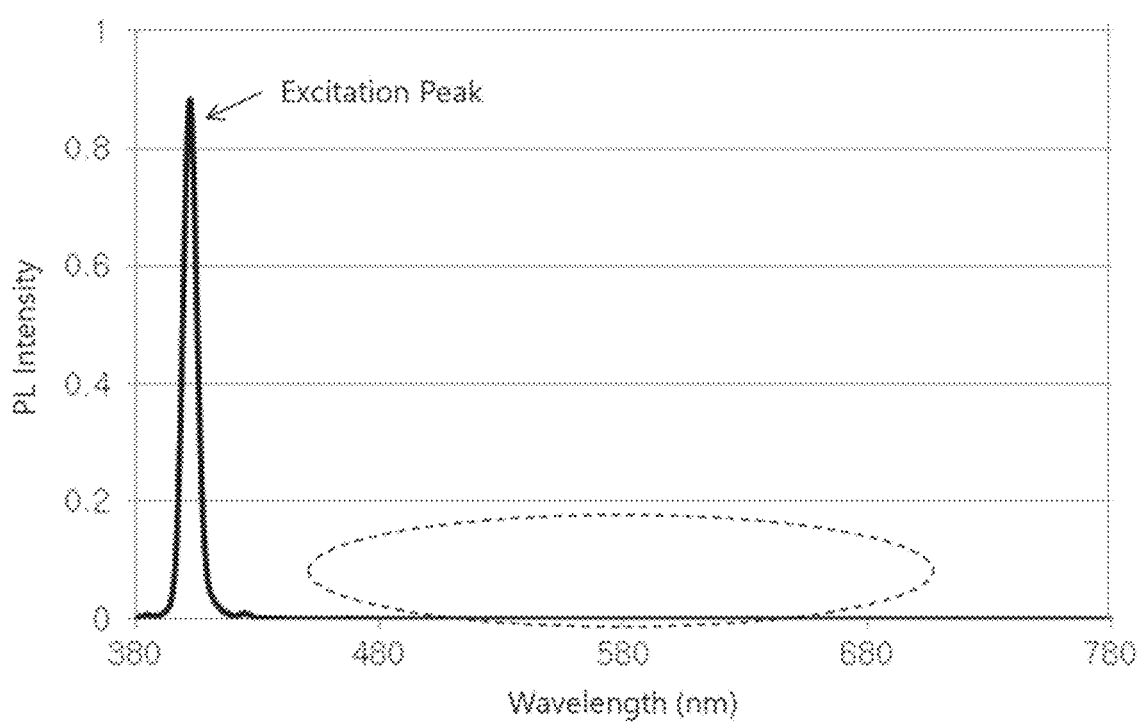
FIG. 10 shows an example of a result of measuring a PL spectrum of nano-particles according to the embodiment of the present disclosure.

FIG. 9 shows an absorption spectrum of semiconductor nano-particles according to one embodiment of the present disclosure. FIG. 10 shows a result of measuring the PL spectrum of semiconductor nano-particles according to an embodiment of the present disclosure.

Particularly, FIG. 9 shows a result of measuring UV/Vis absorption spectrum of 5 nm-sized $ZnSe_{0.72}Te_{0.28}$ particles and 7 nm-sized $ZnSe_{0.72}Te_{0.28}$ particles. Referring to FIG. 9, it can be identified that the 5 nm-sized $ZnSe_{0.72}Te_{0.28}$ particles absorb light with a wavelength of about 490 nm or smaller and the 7 nm-sized $ZnSe_{0.72}Te_{0.28}$ particles absorb light with a wavelength of about 530 nm or smaller.

FIG. 10 shows a result of measuring the photoluminescence (PL) spectrum of 5 nm-sized $ZnSe_{0.72}Te_{0.28}$ particles and 7 nm-sized $ZnSe_{0.72}Te_{0.28}$ particles. A 400 nm wavelength light was used as the excitation light. Referring to FIG. 10, 5 nm-sized $ZnSe_{0.72}Te_{0.28}$ particles and 7 nm-sized $ZnSe_{0.72}Te_{0.28}$ particles did not exhibit any photoluminescence peak in the wavelength band of green light and red light.

Figure 11:
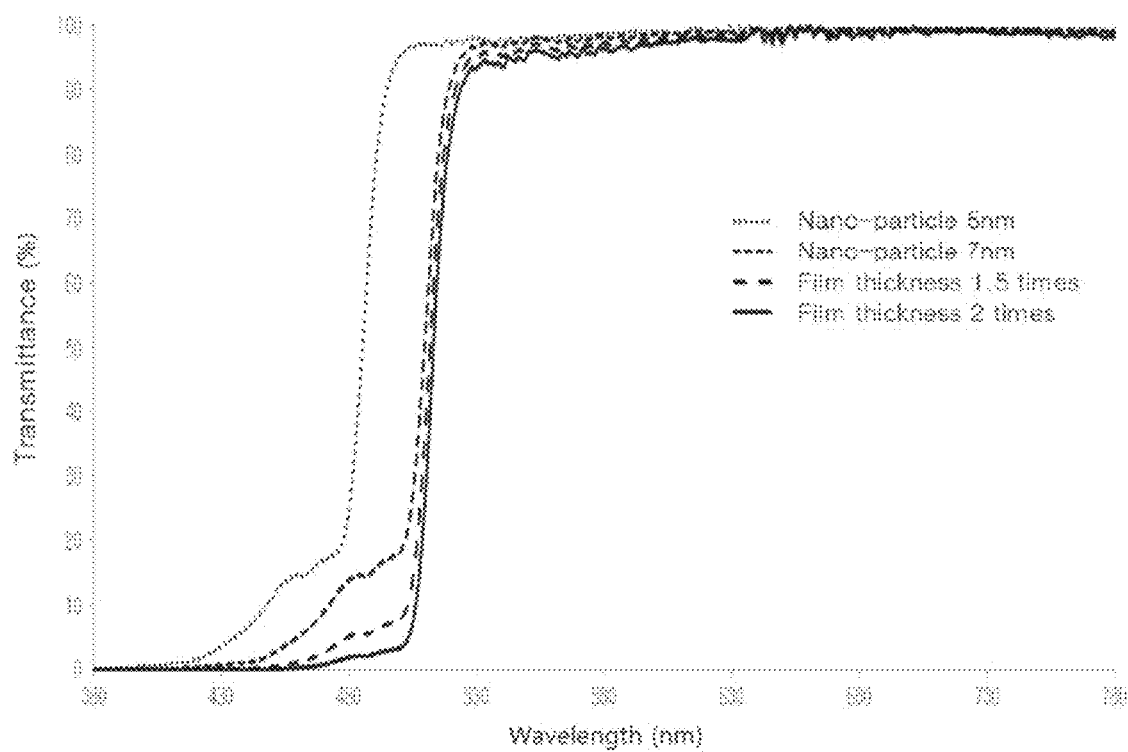
FIG. 11 shows transmittance of each of light-absorbing layers according to an embodiment of the present disclosure.

FIG. 11 shows transmittances of the light-absorbing layers according to an embodiment of the present disclosure. FIG. 11 shows transmittances of a 2 μm-thick light-absorbing layer including 5 nm-sized $ZnSe_{0.72}Te_{0.28}$ particles (Nano-particle 5 nm in FIG. 11), a 2 μm-thick light-absorbing layer including 7 nm-sized $ZnSe_{0.72}Te_{0.28}$ particles (Nano-particle 7 nm in FIG. 11), a 3 μm-thick light-absorbing layer including 7 nm-sized $ZnSe_{0.72}Te_{0.28}$ particles (Film thickness 1.5 times in FIG. 11), and a 4 μm-thick light-absorbing layer including 7 nm-sized $ZnSe_{0.72}Te_{0.28}$ particles for (Film thickness 2 times in FIG. 11).

Referring to FIG. 11, it can be identified that the 2 μm-thick light-absorbing layer including 5 nm-sized $ZnSe_{0.72}Te_{0.28}$ particles has a high transmittance of 90% or greater for light with a wavelength of approximately 490 nm or larger, and the 2 μm-thick light-absorbing layer including 7 nm-sized $ZnSe_{0.72}Te_{0.28}$ particles has a high transmittance of 90% or greater for light with a wavelength of approximately 530 nm or larger. It can be identified that the 2 μm-thick light-absorbing layer including 5 nm-sized $ZnSe_{0.72}Te_{0.28}$ particles transmits a portion of blue light of the wavelength of 490 nm or smaller, and the 2 μm-thick light-absorbing layer including 7 nm-sized $ZnSe_{0.72}Te_{0.28}$ particles transmits a portion of blue light of the wavelength of 530 nm or smaller. It can be identified that as the size of the $ZnSe_{0.72}Te_{0.28}$ particle increases from 5 nm to 7 nm, a red-shift occurs. As the thickness of the light-absorbing layer including 7 nm-sized $ZnSe_{0.72}Te_{0.28}$ particles increases from 2 μm to 4 μm, the transmittance of blue light of the wavelength of 530 nm or smaller decreases.

Figure 12:
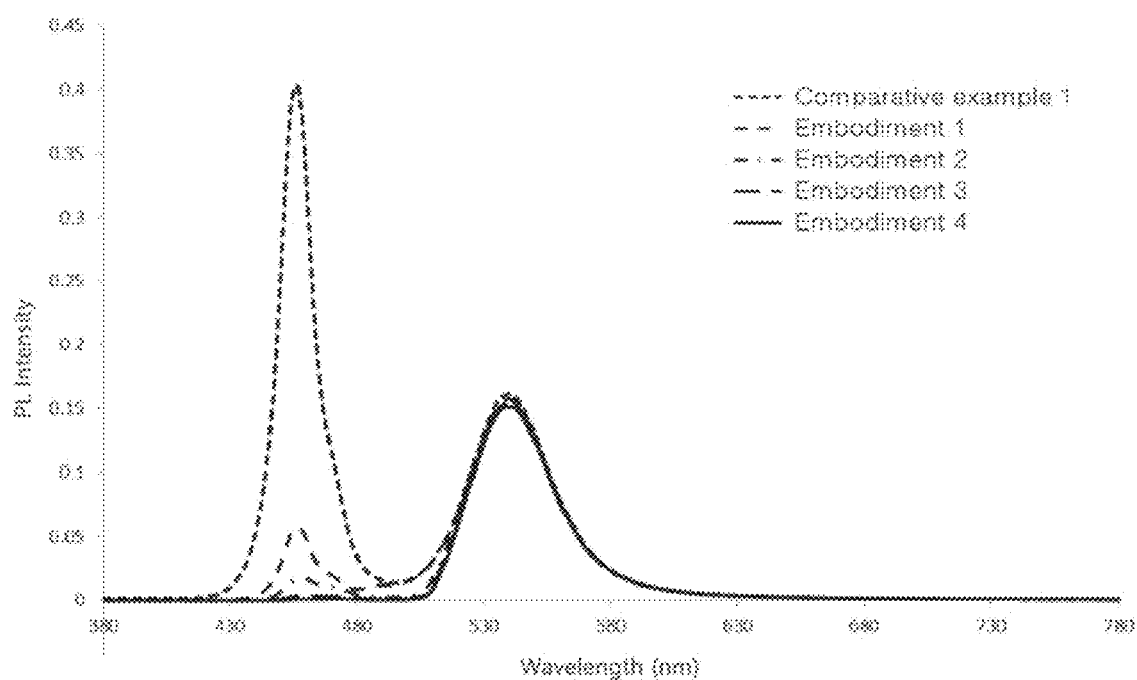
FIG. 12 shows photoluminescence (PL) spectra of various embodiments of the present disclosure including photoluminescent layers including green quantum dots and various light-absorbing layers, respectively.

FIG. 12 shows photoluminescence (PL) spectra of various embodiments of the present disclosure including a photoluminescent layer including green quantum dots and various light-absorbing layers, respectively.

More specifically, FIG. 12 shows photoluminescence (PL) spectra for a stack structure (comparative example 1) of a blue light-emitting element/a photoluminescent layer including green quantum dots (without a light-absorbing layer according to the present disclosure), a stack structure (the embodiment 1) of a blue light-emitting element/a photoluminescent layer including green quantum dot/a 2 μm-thick light-absorbing layer including 5 nm-sized $ZnSe_{0.72}Te_{0.28}$ particles, a stack structure (the embodiment 2) of a blue light-emitting element/a photoluminescent layer including green quantum dots/a 2 μm-thick light-absorbing layer including 7 nm-sized $ZnSe_{0.72}Te_{0.28}$ particles, a stack structure (the embodiment 3) of a blue light-emitting element/a photoluminescent layer including green quantum dots/a 3 μm-thick light-absorbing layer including 7 nm-sized $ZnSe_{0.72}Te_{0.28}$ particles, and a stack structure (the embodiment 4) of a blue light-emitting element/a photoluminescent layer including a green quantum dot/a 4 μm-thick light-absorbing layer including 7 nm-sized $ZnSe_{0.72}Te_{0.28}$ particles.

Referring to FIG. 12, in the comparative example 1, a blue light peak is mainly observed along with a green light peak. In the embodiment 1 to the embodiment 4 equipped with the light-absorbing layers, an intensity of the blue light peak was significantly reduced, compared to the comparative example 1. When comparing the embodiment 1 and the embodiment 2 with each other, it can be identified that as the size of the $ZnSe_{0.72}Te_{0.28}$ particle increases, the intensity of the peak of the blue light decreases. When comparing the embodiments 2 to 4 with each other, it can be identified that the intensity of the peak of blue light decreases as the thickness of the light-absorbing layer increases. In the embodiment 4, no blue light peak was observed.

Table 1 below shows a luminance ratio (with respect to green light) of the comparative example 1 and the embodiment 1 to the embodiment 4 as described above. Table 1 below also shows the luminance ratio for a comparative example 2 which has a stack structure of a blue light-emitting element/a photoluminescent layer including green quantum dots/a low refractive index layer/a green color filter layer (FIG. 16). It can be identified that the embodiments 1 to 4 have lower luminance than that in the comparative example 1 without the light-absorbing layer, while the luminance thereof is much higher than that in the comparative example 2 using the green color filter layer.

TABLE 1

| | Comparative example 1 | Comparative example 2 | The embodiment 1 | The embodiment 2 | The embodiment 3 | The embodiment 4 |
|---|---|---|---|---|---|---|
| Luminance ratio (green light) | 100% (reference) | 55.1% | 92.1% | 88.7% | 86.6% | 85% |

Figure 13:
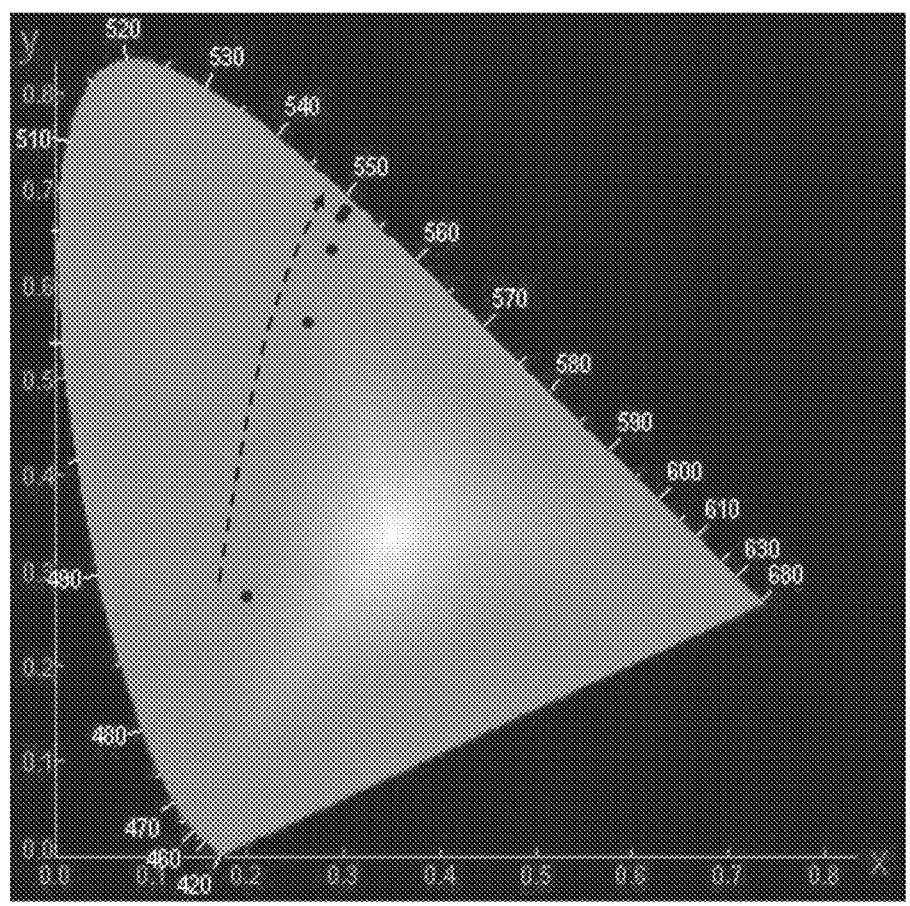
FIG. 13 shows color coordinates of various embodiments of the present disclosure including photoluminescent layers including green quantum dots and various light-absorbing layers, respectively in a CIE 1931 color space.

FIG. 13 shows the color coordinates of various embodiments of the present disclosure including a photoluminescent layer including green quantum dots and various light-absorbing layers respectively, in a CIE 1931 color space. FIG. 13 indicates x and y color coordinates of the comparative example 1 and the embodiments 1 to 4 in the CIE 1931 color space.

Referring to FIG. 13, the embodiment 1 to the embodiment 4 are located in the green area. As the example gradually changes from the embodiment 1 to the embodiment 4, the x and y coordinates, especially, the y coordinates increases. The color purity of the green improves as the example gradually change from the embodiment 1 to the embodiment 4.

Figure 14:
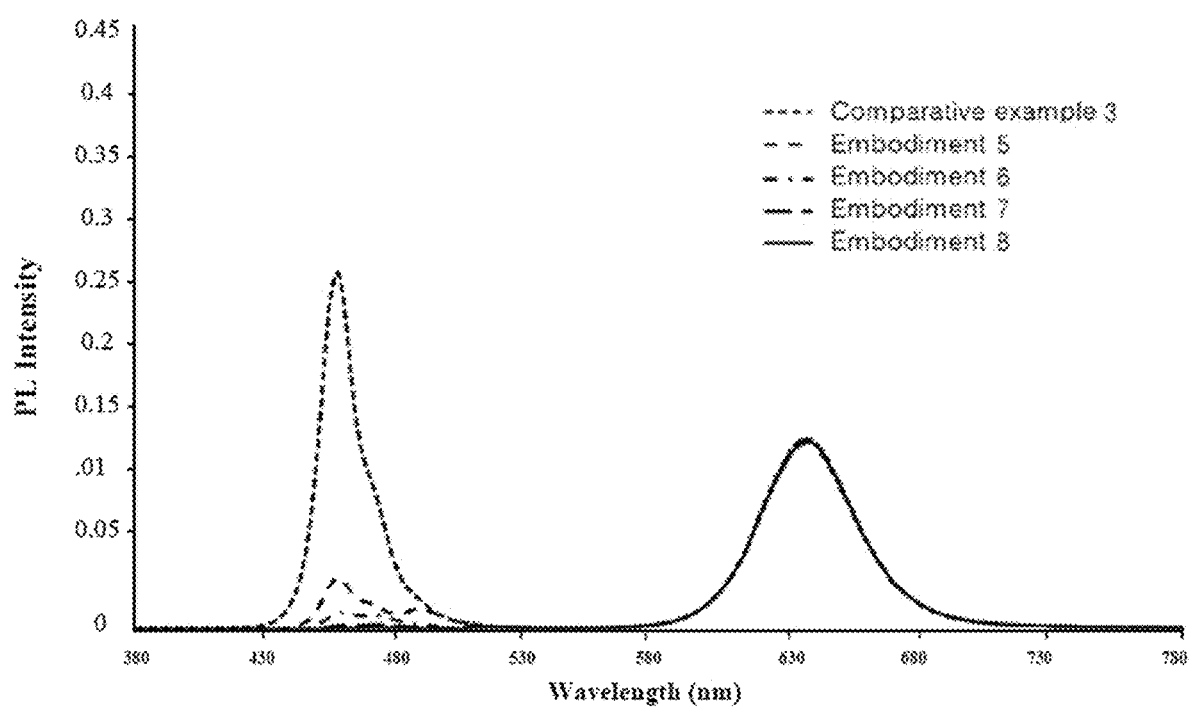
FIG. 14 shows photoluminescence (PL) spectra of various embodiments of the present disclosure including a photoluminescent layer including a red quantum dot and various light-absorbing layers, respectively.

FIG. 14 shows the PL spectrum of each of various embodiments of the present disclosure including a photoluminescent layer including a red quantum dot and various light-absorbing layers, respectively.

More specifically, FIG. 14 shows photoluminescence (PL) spectra of a stack structure (comparative example 3) of a blue light-emitting element/a photoluminescent layer including red quantum dots (without a light-absorbing layer according to the present disclosure), a stack structure (the embodiment 5) of a blue light-emitting element/a photoluminescent layer including red quantum dots/a 2 μm-thick light-absorbing layer including 5 nm-sized $ZnSe_{0.72}Te_{0.28}$ particles, a stack structure (the embodiment 6) of a blue light-emitting element/a photoluminescent layer including red quantum dots/a 2 μm-thick light-absorbing layer including 7 nm-sized $ZnSe_{0.72}Te_{0.28}$ particles, a stack structure (the embodiment 7) of a blue light-emitting element/a photoluminescent layer including red quantum dots/a 3 μm-thick light-absorbing layer including 7 nm-sized $ZnSe_{0.72}Te_{0.28}$ particles, and a stack structure (the embodiment 8) of a blue light-emitting element/a photoluminescent layer including a red quantum dot/a 4 μm-thick light-absorbing layer including 7 nm-sized $ZnSe_{0.72}Te_{0.28}$ particles.

Referring to FIG. 14, in the comparative example 3, the blue light peak is mainly observed along with the red light peak. In the embodiment 5 to the embodiment 8 equipped with light-absorbing layers, an intensity of the blue light peak was significantly reduced, compared to that of Comparative example 3. When comparing the embodiment 5 and the embodiment 6 with each other, it can be identified that as the size of the $ZnSe_{0.72}Te_{0.28}$ particle increases, the intensity of the peak of the blue light decreases. When comparing the embodiment 6 with the embodiment 8, it can be identified that as the thickness of the light-absorbing layer increases, the intensity of the peak of the blue light decreases. In the embodiment 8, no blue light peak was observed.

Table 2 below shows the luminance ratio (with respect to red light) of the comparative example 3 and the embodiment 5 to the embodiment 8. Table 2 below also shows the luminance ratio of a comparative example 4 which has a stack structure of a blue light-emitting element/a photoluminescent layer including red quantum dots/a low refractive index layer/a red color filter layer (FIG. 16). It can be identified that the embodiments 5 to 8 have lower luminance than that in the comparative example 3 without the light-absorbing layer, while the luminance thereof is much higher than that in the comparative example 4 using the red color filter layer.

TABLE 2

|  | Comparative example 3 | Comparative example 4 | The embodiment 5 | The embodiment 6 | The embodiment 7 | The embodiment 8 |
| --- | --- | --- | --- | --- | --- | --- |
| Luminance ratio (red light) | 100% (reference) | 56.1% | 84.3% | 80.1% | 78.3% | 77.4% |

Figure 15:
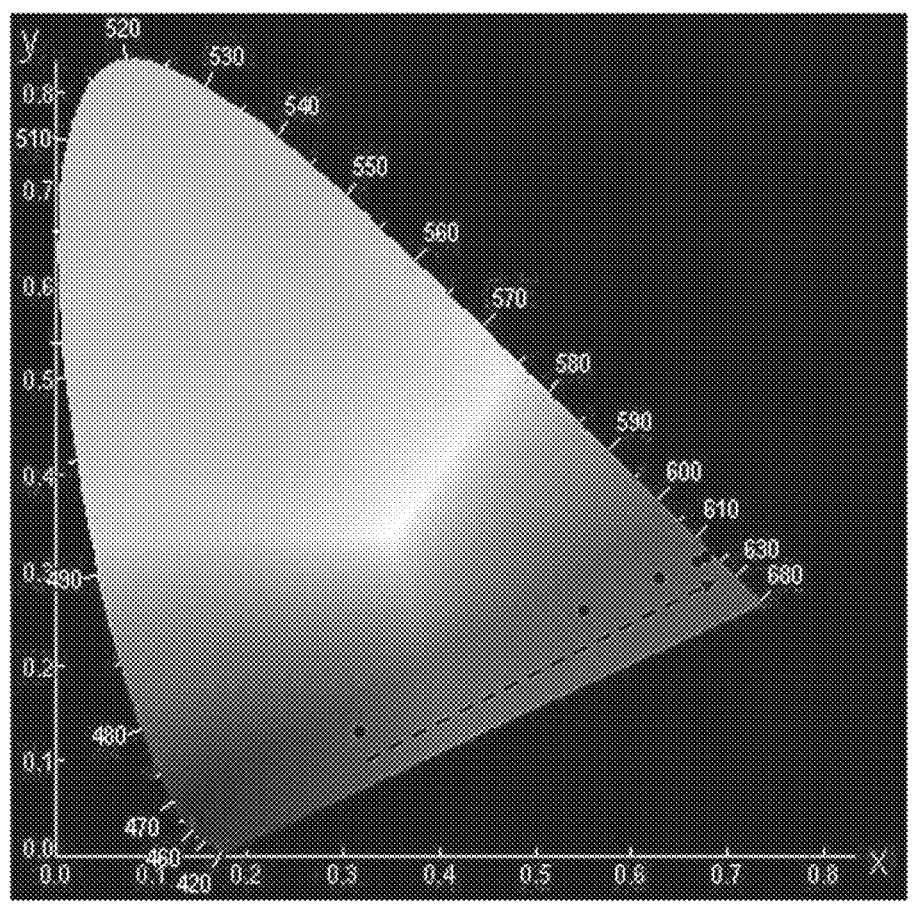
FIG. 15 shows color coordinates of various embodiments of the present disclosure including photoluminescent layers including red quantum dots and various light-absorbing layers, respectively in a CIE 1931 color space.

FIG. 15 shows the color coordinates of various embodiments of the present disclosure including a photoluminescent layer including red quantum dots and various light-absorbing layers respectively, in a CIE 1931 color space. FIG. 15 indicates the x and y color coordinates of the comparative example 3 and the embodiments 5 to 8 of FIG. 14 in the CIE 1931 color space. Referring to FIG. 15, the embodiment 5 to the embodiment 8 are located in a red area. As the example gradually changes from the embodiment 5 to the embodiment 8, the x and y coordinates, especially the x coordinate increases. The color purity of the red color improves as the example gradually changes from the embodiment 5 to the embodiment 8.

Figure 2:
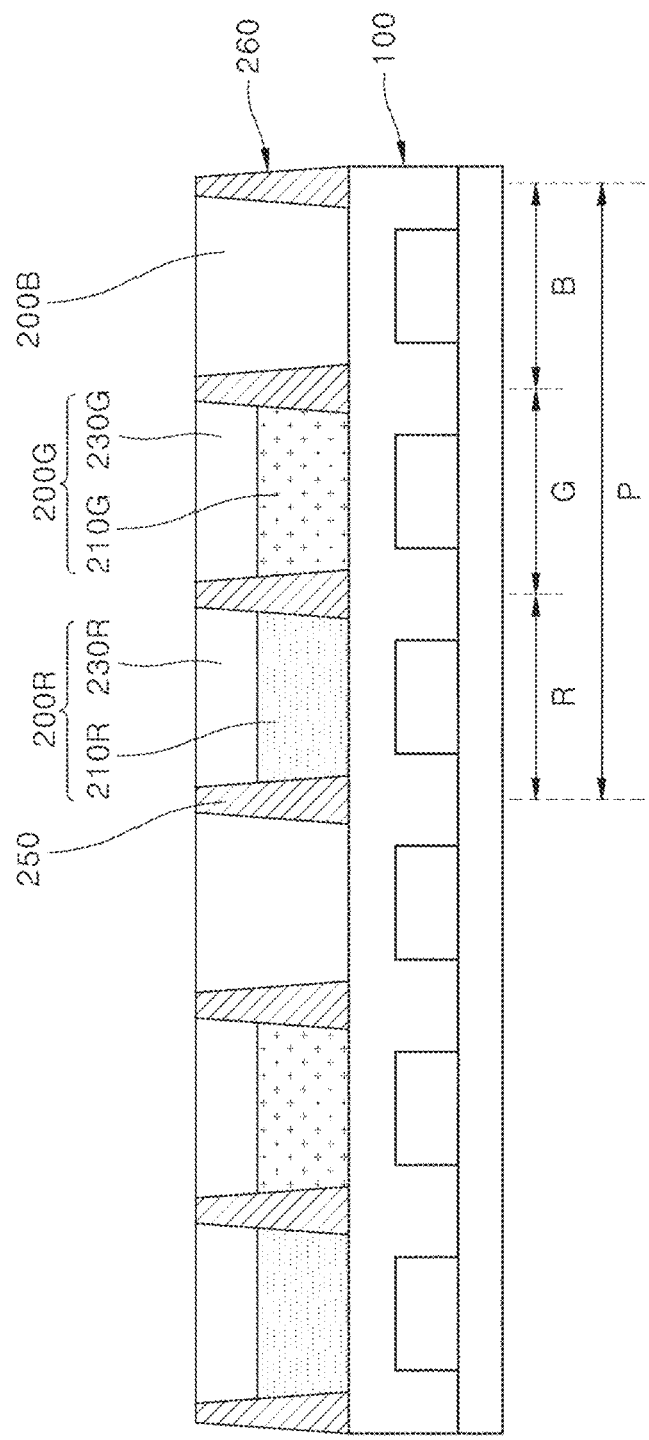
FIG. 2 is a drawing schematically showing a display device according to one embodiment of the present disclosure.

FIG. 2 is a drawing schematically showing a display device according to one embodiment of the present disclosure.

Referring to FIG. 2, the display device according to one embodiment of the present disclosure includes an array substrate 100 including light-emissive elements respectively disposed in a red sub-pixel area R, a green sub-pixel area G, and a blue sub-pixel area B, and a color filter substrate 260 including a red color filter structure 200R disposed on a red sub-pixel area R of the array substrate 100, and a green color filter structure 200G disposed on a green sub-pixel area G of the array substrate 100.

The color filter substrate 260 can further include a blue color filter structure 200B disposed on a blue sub-pixel area B of the array substrate 100.

The red color filter structure 200R, the green color filter structure 200G, and the blue color filter structure 200B can be distinguished from each other by partition walls 250 disposed respectively at boundaries of the sub-pixel areas. The partition wall 250 can be embodied as a black matrix.

After forming the array substrate 100, the partition walls 250 defining the red, green, and blue sub-pixel areas are formed. Then, the red color filter structure 200R, the green color filter structure 200G and the blue color filter structure 200B are formed respectively in the red, green, and blue sub-pixel areas defined by the partition walls 250. Thus, the display device as shown in FIG. 2 can be manufactured.

The color filter structure 200 as described with reference to FIG. 1 can be applied to each of the red color filter structure 200R and the green color filter structure 200G. In describing the red color filter structure 200R and the green color filter structure 200G, contents that are duplicated with the descriptions referring to FIG. 1 will be omitted or briefly described.

The red color filter structure 200R includes a red light-conversion layer 210R and a first light-absorbing layer 230R. The red light-conversion layer 210R can be composed of the first resin in which the red quantum dots of the core/shell structure are dispersed. The first light-absorbing layer 230R stacked on the red light-conversion layer 210R can be composed of the second resin in which semiconductor nano-particles that absorb light emitted from the light-emissive elements of the array substrate 100 and scattering-particles are dispersed.

The green color filter structure 200G includes a green light-conversion layer 210G and a second light-absorbing layer 230G. The green light-conversion layer 210G can be composed of the first resin in which green quantum dots of the core/shell structure are dispersed. The second light-absorbing layer 230G stacked on the green light-conversion layer 210G can be composed of the second resin in which semiconductor nano-particles that absorb light emitted from the light-emissive elements of the array substrate 100, and scattering-particles are dispersed. For example, the second light absorption layer 230G can be made of the same materials as the first light absorption layer 230R.

The light-emissive elements of the array substrate 100, for example, can emit blue light. Each of the red quantum dots and the green quantum dots can have an InP (core)/ZnSe (primary shell)/ZnS (secondary shell) structure in one example. The semiconductor nano-particle can have a size of 1 to 10 nm. For example, the size thereof can be 5 to 7 nm. The semiconductor nano-particle 234 can be made of a group II-VI compound semiconductor or a group III-V compound semiconductor. The semiconductor nano-particle can be made of, for example, $ZnSe_xTe_{1-x}$ (x can be 0.72 to 0.9). The scattering-particle can be made of at least one selected from a group consisting of for example, $TiO_2$, ZnO, $ZrO_2$, and the like. The first resin and the second resin can have the same refractive index and can include an acrylic or epoxy resin.

The blue color filter structure 200B can be composed of a third resin in which scattering-particles are dispersed. The third resin can be made of the same resin as the first resin and the second resin, and can be an acrylic or epoxy resin. The scattering-particle can be made of at least one selected from a group consisting of for example, $TiO_2$, ZnO, $ZrO_2$, and the like.

Figure 3:
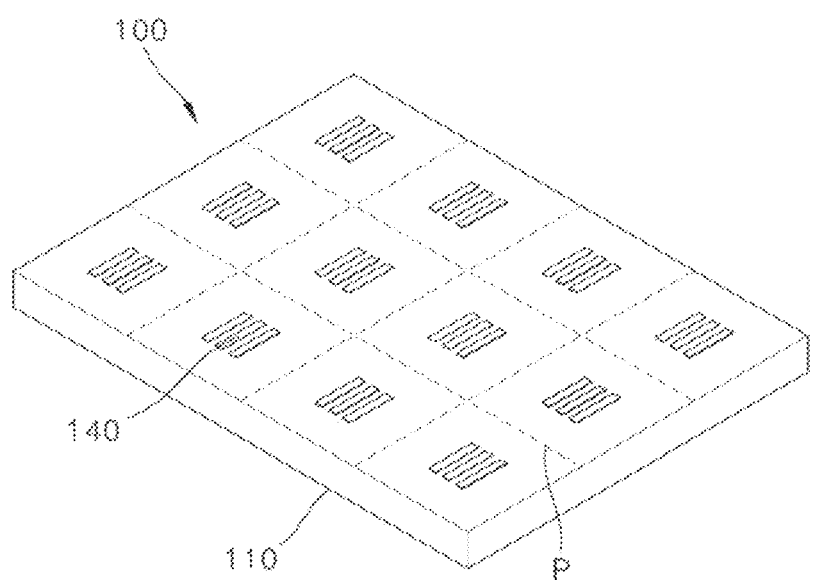
FIG. 3 is a perspective view schematically showing an array substrate of a display device according to one embodiment of the present disclosure.
Figure 4:
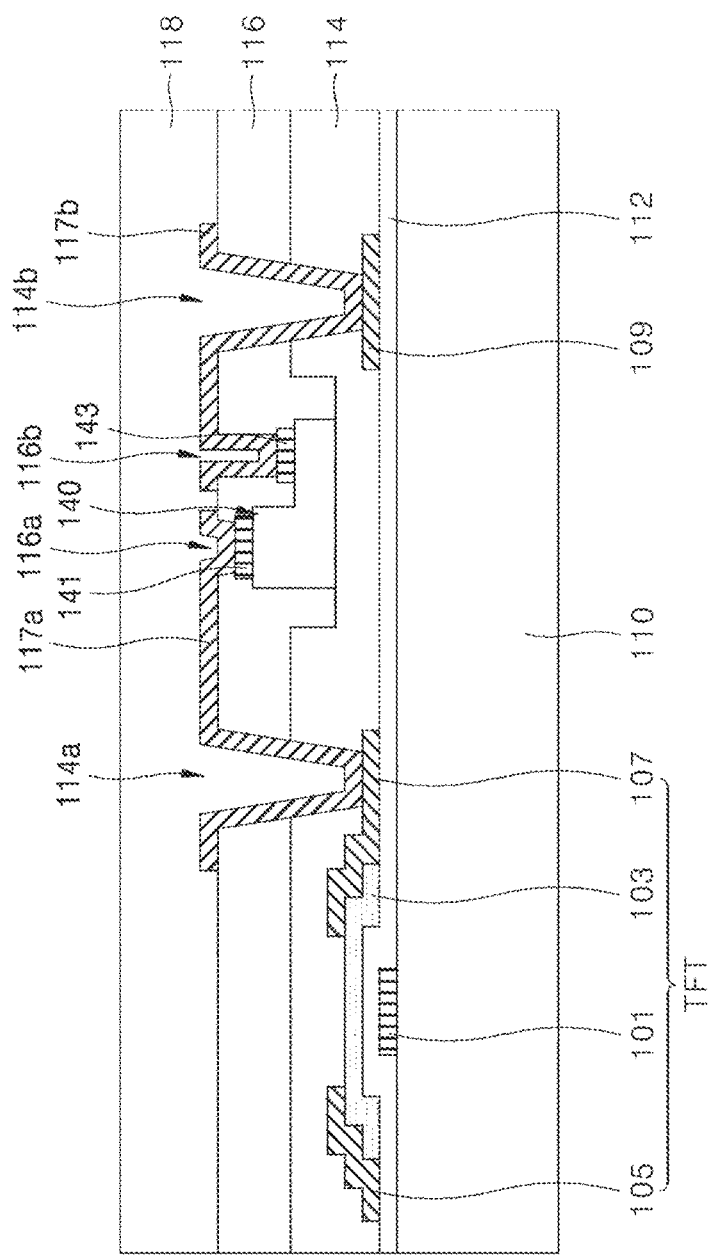
FIG. 4 is a cross-sectional view showing an array substrate of a display device according to one embodiment of the present disclosure.
Figure 5:
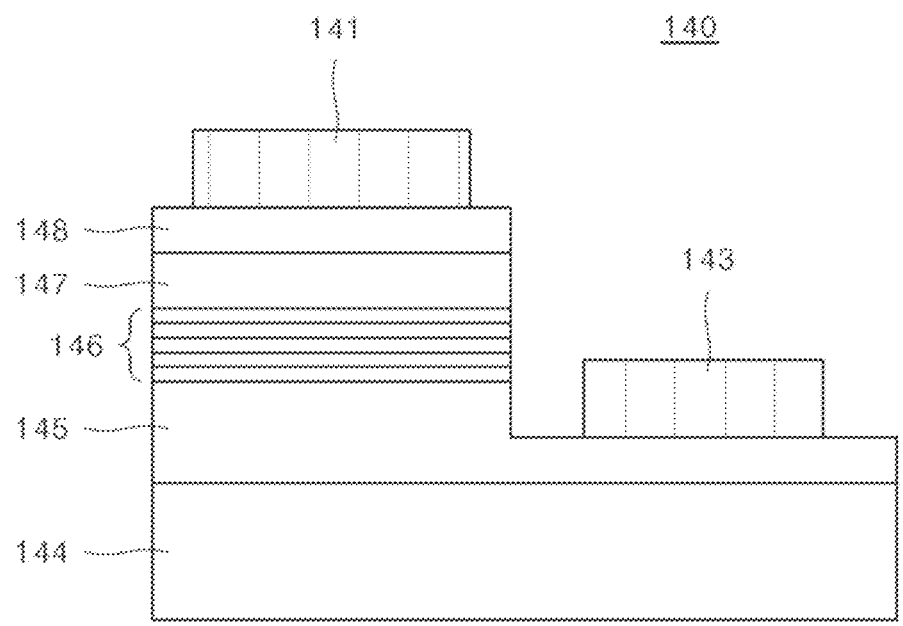
FIG. 5 is a cross-sectional view showing a structure of a micro light-emitting diode shown in FIG. 4.

FIG. 3 is a perspective view schematically showing an array substrate of a display device according to one embodiment of the present disclosure. FIG. 4 is a cross-sectional view showing an array substrate of a display device according to one embodiment of the present disclosure. FIG. 5 is a cross-sectional view showing a structure of a micro light-emitting diode shown in FIG. 4.

As shown in FIG. 3, an array substrate 100 of the display device according to one embodiment of the present disclosure can include a substrate 110 and a plurality of micro light-emitting diodes 140 mounted on the substrate 110.

The substrate 110 can be made of a transparent material such as glass and plastic, and has a plurality of pixel areas P. A thin-film transistor to drive the micro light-emitting diodes 140 arranged in the pixel areas P, and various lines (gate lines, and data lines) are formed on the substrate 110. A driving signal input from an outside is applied to the micro light-emitting diodes 140 via the lines. Thus, the micro light-emitting diodes 140 can emit light, and thus an image can be realized. Each pixel area P can include a plurality of sub-pixel areas, for example, a red sub-pixel area, a green sub-pixel area, and a blue sub-pixel area. A micro light-emitting diode 140 can be disposed in each sub-pixel area.

The micro light-emitting diodes 140 can be manufactured using a process separate from a TFT array process that forms thin-film transistors on the substrate 110, and then can be transferred onto the substrate 110.

The micro light-emitting diode 140 can be an LED having a size of 10 to 100 μm. The micro light-emitting diode 140 can be formed by growing a plurality of thin-films made of an inorganic semiconductor material including Al, Ga, N, P, As, In, etc. on a sapphire substrate or a silicon substrate, and then cutting and separating the sapphire substrate or the silicon substrate.

As shown in FIG. 4, a thin-film transistor TFT is disposed on the substrate 110. The substrate 110 can be made of a transparent material such as glass and plastic, but is not limited thereto. Alternatively, the substrate 110 can be made of various transparent materials. The substrate 110 can be made of a flexible and transparent material.

The thin-film transistor TFT includes a gate electrode 101 formed on the substrate 110, a gate insulating layer 112 formed over an entire area of the substrate 110 to cover the gate electrode 101, a semiconductor layer 103 formed on the gate insulating layer 112, and a source electrode 105 and a drain electrode 107 formed on the semiconductor layer 103. The gate electrode 101 can be made of metals such as Cr, Mo, Ta, Cu, Ti, Al, or alloys thereof. The gate insulating layer 112 can be composed of a single layer made of an inorganic insulating material such as $SiO_x$ or $SiN_x$, or can be composed of a plurality of layers made of $SiO_x$ and $SiN_x$. The semiconductor layer 103 can be made of a silicon semiconductor such as amorphous silicon or polycrystalline silicon, or can be made of an oxide semiconductor such as IGZO (Indium Gallium Zinc Oxide), $TiO_2$, ZnO, $WO_3$, and $SnO_2$. When forming the semiconductor layer 103 using an oxide semiconductor, a size of thin-film transistor TFT can be reduced and a driving power can be reduced. In accordance with the present disclosure, the semiconductor layer of the thin-film transistor is not limited to a specific material. All kinds of semiconductor materials currently used in thin-film transistors can be used as the material of the semiconductor layer. Each of the source electrode 105 and the drain electrode 107 can be made of a metal such as Cr, Mo, Ta, Cu, Ti, Al, or an alloy thereof. In this connection, the drain electrode 107 acts as a first electrode that applies a signal to the micro light-emitting diode.

In one example, in the drawing, the thin-film transistor TFT is shown as a bottom gate type thin-film transistor. However, the present disclosure is not limited thereto. The thin-film transistor can be embodied as a top gate type thin-film transistor. Thus, the thin-film transistors of various structures can be employed.

Further, the second electrode 109 is formed on the gate insulating layer 114. In this connection, the second electrode 109 can be made of metals such as Cr, Mo, Ta, Cu, Ti, Al, or alloys thereof and can be formed using the same process as a formation process of the first electrode 107, for example, the drain electrode of the thin-film transistor.

A first insulating layer 114 is formed on the substrate 110 on which the thin-film transistor TFT is formed. A micro light-emitting diode 140 is disposed on the first insulating layer 114. In this connection, in the drawing, a portion of the first insulating layer 114 is removed away, and the micro light-emitting diode 140 is disposed in the removed are. Alternatively, the first insulating layer 114 may not be removed. The first insulating layer 114 can be composed of an organic layer made of photoacrylic, or can be composed of a stack of an inorganic layer/an organic layer, or can be composed of a stack of an inorganic layer/an organic layer/an inorganic layer.

The micro light-emitting diode 140 is typically made of an III-V nitride semiconductor. The present disclosure is not limited thereto.

FIG. 5 is a drawing showing a structure of the micro light-emitting diode 140 of the display device according to one embodiment in the present disclosure. As shown in FIG. 5, the micro light-emitting diode 140 includes an undoped GaN layer 144, an n-type GaN layer 145 disposed on the undoped GaN layer 144, an active layer 146 having a multi-quantum-well (MQW) structure and disposed on the n-type GaN layer 145, a p-type GaN layer 147 disposed on the active layer 146, an ohmic contact layer 148 made of a transparent conductive material and disposed on the p-type GaN layer 147, a p-type electrode 141 in contact with a portion of the ohmic contact layer 148, and an n-type electrode 143 in contact with a portion of the n-type GaN layer 145 as exposed by partially etching the active layer 146, the p-type GaN layer 147, and the ohmic contact layer 148.

The n-type GaN layer 145 can act as a layer for supplying electrons to the active layer 146, and can be formed by doping a GaN semiconductor layer with n-type impurities such as Si.

The active layer 146 can acts a layer in which injected electrons and holes are combined with each other to emit light. The multi-quantum-well structure of the active layer 146 can have a structure in which a plurality of barrier layers and a plurality of well layers are alternately stacked with each other. In one example, the well layer can be composed of an InGaN layer while the barrier layer can be composed of the GaN layer. The present disclosure is not limited thereto.

The p-type GaN layer 147 can act as a layer for injecting holes into the active layer 146, and can be formed by doping p-type impurities such as Mg, Zn, and Be into the GaN semiconductor layer.

The ohmic contact layer 148 can function to achieve an ohmic contact between the p-type GaN layer 147 and the p-type electrode 141, and can be made of transparent metal oxides such as ITO (Indium Tin Oxide), IGZO (Indium Gallium Zinc Oxide), and IZO (Indium Zinc Oxide).

Each of the p-type electrode 141 and the n-type electrode 143 can be composed of a single layer or a plurality of layers made of at least one metal among Ni, Au, Pt, Ti, Al, and Cr, or an alloy thereof.

The micro light-emitting diode 140 has a size of about 10 to 100 µm. The micro light-emitting diode 140 can be manufactured by forming a buffer layer on a growth substrate and then growing a GaN thin-film or an InGaN thin-film on the buffer layer. In this connection, the substrate used for the growth of the GaN thin-film can be made of sapphire, silicon (si), GaN, silicon carbide (SiC), gallium arsenide (GaAs), zinc oxide (ZnO), and the like.

Further, when the growth substrate is made of a material other than GaN, a lattice mismatch occurs when the n-GaN layer 120 as an epi layer is directly grown on the growth substrate. This mismatch can lead to deterioration of a quality of the thin-film. For this reason, the buffer layer can be used to prevent the lattice mismatch and can be made of AlN or GaN.

The micro light-emitting diode 140 is not limited to the micro light-emitting diode of the structure shown in FIG. 5. A micro light-emitting diode having various structures such as a vertical structure or a horizontal structure can be applied.

Again, referring to FIG. 4, the second insulating layer 116 is formed on the first insulating layer 114 on which the micro light-emitting diode 140 is mounted. In this connection, the second insulating layer 116 can be composed of an organic layer made of photoacrylic, or can be composed of a stack of an inorganic layer/an organic layer or can be composed of a stack of an inorganic layer/an organic layer/an inorganic layer. The second insulating layer 116 can covers a top of the micro light-emitting diode 140.

Each of a first contact hole 114a and a second contact hole 114b can be formed in the first insulating layer 114 and the second insulating layer 116. Thus, the drain electrode 107 of the thin-film transistor TFT and the second electrode 109 are exposed to an outside through the first contact hole 114a and the second contact hole 114b, respectively. Further, a third contact hole 116a and a fourth contact hole 116b are respectively formed in a portion of the second insulating layer 116 on the p-type electrode 141 and a portion of the second insulating layer 116 on the n-type electrode 143 of the micro light-emitting diode 140. Thus, the p-type electrode 141 and the n-type electrode 143 are exposed to the outside through the third contact hole 116a and the fourth contact hole 116b, respectively.

A first connection electrode 117a and a second connection electrode 117b made of a transparent metal oxide such as ITO, IGZO or IGO are formed on a top face of the second insulating layer 116. Thus, the drain electrode 107 of the thin-film transistor TFT and the p-type electrode 141 of the micro light-emitting diode 140 are electrically connected to each other via the first contact hole 114a and the third contact hole 116a and the first connection electrode 117a. Further, the second electrode 109 and the n-type electrode 143 of the micro light-emitting diode 140 are electrically connected to each other via the second contact hole 114b and the fourth contact hole 116b, and the second connection electrode 117b.

Further, a buffer layer 118 made of an inorganic material and/or an organic material is formed on the substrate 110 to cover and protect the micro light-emitting diode 140, the first connection electrode 117a, and the second connection electrode 117b.

Figure 6:
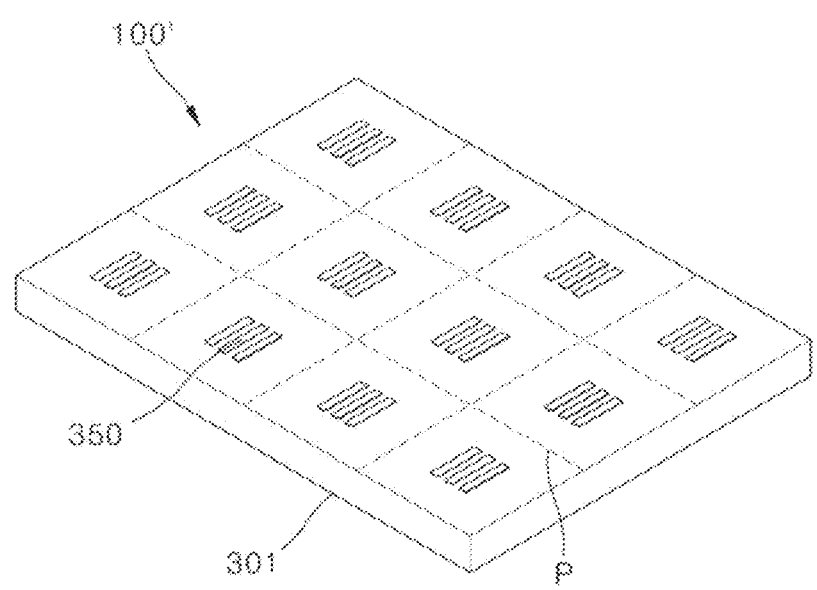
FIG. 6 is a perspective view schematically showing an array substrate of a display device according to one embodiment of the present disclosure.
Figure 7:
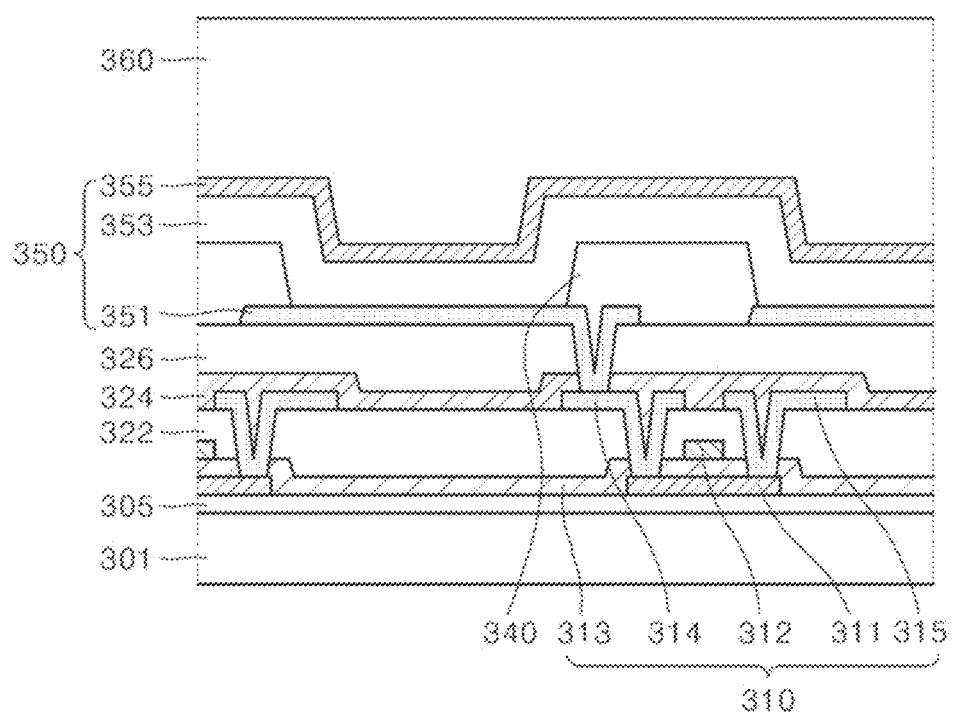
FIG. 7 is a cross-sectional view showing an array substrate of a display device according to one embodiment of the present disclosure.

FIG. 6 is a perspective view schematically showing an array substrate of a display device according to one embodiment of the present disclosure. FIG. 7 is a cross-sectional view showing an array substrate of a display device according to one embodiment of the present disclosure.

As shown in FIG. 6, an array substrate 100' of a display device according to one embodiment of the present disclosure can include a substrate 301 and a plurality of organic light-emitting diodes OLED 350 mounted on the substrate 301.

The substrate 301 can be made of a transparent material such as glass and plastic and can have a plurality of pixel areas P. A thin-film transistor to drive the organic light-emitting diodes 350 arranged in the pixel areas P, and various lines (gate lines, and data lines) are formed on the substrate 301. A driving signal input from an outside is applied to the organic light-emitting diodes 350 via the lines. Thus, the organic light-emitting diodes 350 emit light beams, so that an image can be realized. Each pixel area P can include a plurality of sub-pixel areas, for example, a red sub-pixel area, a green sub-pixel area, and a blue sub-pixel area. An organic light-emitting diode 350 can be disposed in each sub-pixel area.

As shown in FIG. 6, the array substrate 100' can include a buffer layer 305 formed on the substrate 301, thin-film transistors 310, organic light-emitting diodes 350, a bank 340, and an encapsulation layer 360.

Before forming the thin-film transistors 310, the buffer layer 305 can be formed on the substrate 301. The buffer layer 305 protects the thin-film transistor 310 and the organic light-emitting diodes 350 from moisture invading through the substrate 301. The buffer layer 305 can be made of an insulating material such as silicon oxide, silicon nitride, or silicon oxynitride SiON. The buffer layer 305 can be composed of multiple layers made of insulating materials.

The thin-film transistor 310 can be disposed on the buffer layer 305. The thin-film transistor 310 includes an active layer 311, a gate electrode 312, a gate insulating layer 313, a source electrode 314, and a drain electrode 315. FIG. 7 shows that the thin-film transistor 310 has a coplanar structure by way of example. However, the disclosure is not limited thereto. The thin-film transistor 310 can be formed in various shapes such as an inverted staggered structure. On the buffer layer 305, the active layer 311 composed of a semiconductor film can be formed. The active layer 311 can be made of an oxide semiconductor, or can be made of amorphous or polycrystalline silicon. Impurities can be doped into both opposing edge portions of the active layer 311.

The gate insulating layer 313 can be disposed on the active layer 311. The gate insulating layer 313 can be formed across an entire top face of the substrate 301. The gate insulating layer 313 can be made of silicon oxide in one example.

A gate electrode 312 corresponding to at least a partial area of the active layer 311 can be disposed on the gate insulating layer 313. The gate electrode 312 can be composed of a single layer or multiple layers made of molybdenum (Mo), aluminum (Al), chromium (Cr), gold (Au), titanium (Ti), nickel (Ni), neodymium (Nd), and copper (Cu), or an alloy thereof. The gate electrode 312 can be composed of a stack of double metal layers which can be made of copper (Cu) and a MoTi alloy, respectively, in one example.

The interlayer insulating layer 322 can be disposed on the gate electrode 312. The interlayer insulating layer 322 can cover the gate electrode 312 and the gate insulating layer 313. The interlayer insulating layer 322 can be made of an inorganic insulating material such as silicon oxide, silicon nitride, or silicon oxynitride SiON, or can be made of an organic insulating material such as benzocyclobutene or photoacryl.

The source electrode 314 and the drain electrode 315 made of a conductive material such as a metal are formed on the interlayer insulating layer 322, and are electrically and respectively connected to both opposing ends of the active layer 212 as exposed through both opposing contact holes formed in the gate insulating layer 313 and the interlayer insulating layer 322.

A protective layer 324 for protecting the thin-film transistor 310 can be disposed on the interlayer insulating layer 322. The protective layer 324 can be made of an inorganic insulating material, for example, silicon oxide, silicon nitride, silicon oxynitride, and can be composed of a single layer or multiple layers made thereof.

On the protective layer 324, a planarization layer 326 can be disposed to remove a step caused by the thin-film transistor 310. The planarization layer 326 can be made of an organic insulating material such as acryl resin, epoxy resin, phenolic resin, polyamide resin, and polyimide resin.

The organic light-emitting diodes 350 and the bank 340 can be disposed on the planarization layer 326.

Each of the organic light-emitting diodes 350 can include a lower electrode 351, an organic light-emitting layer 353, and an upper electrode 355. The lower electrode 351 can act as an anode, while the upper electrode 255 can act as a cathode.

The lower electrode 351 can be disposed on the planarization layer 326. The lower electrode 351 can be connected to the source electrodes 314 of the thin-film transistors 310 via a contact hole extending through the protective layer 324 and the planarization layer 326.

The bank 340 can be formed on the planarization layer 326 to cover an edge of the lower electrode 251 to define sub-pixel areas. An area where the bank 340 is formed does not emit light, and thus can be defined as a non-light-emitting area. An area where the bank 340 is not formed can be defined as a light emitting area. The bank 340 can be made of an organic material such as acryl resin, epoxy resin, phenolic resin, polyamide resin, and polyimide resin.

The organic light-emitting layer 353 can be formed on the lower electrodes 351 and the bank 340. The organic light-emitting layer 353 can commonly extend across the sub-pixel areas, and can emit blue light.

In this case, the organic light-emitting layer 353 can include a hole injection layer, a hole transporting layer, at least one light-emitting layer, an electron transporting layer, and an electron injection layer.

The organic light-emitting diode 350 can be of a top emission type in which light is emitted upwards. In this case, the lower electrode 351 can act as a reflective electrode. The lower electrode 351 can be made of a metal material with high reflectance, and thus can be composed of a stack structure of aluminum and titanium (Ti/Al/Ti), a stack structure of aluminum and indium tin oxide (ITO) (ITO/Al/ITO), an APC alloy, or a stack structure of an APC alloy and ITO (ITO/APC/ITO). The APC alloy refers to an alloy of silver (Ag), palladium (Pd), and copper (Cu). The upper electrode 355 can commonly extend across the sub-pixel areas. The upper electrode 355 can act as a transmissive electrode. The upper electrode 355 can be made of a transparent conductive material such as indium tin oxide (ITO), antimony tin oxide (ATO), and indium zinc oxide (IZO).

An encapsulation layer 360 can be disposed on the upper electrode 355 to prevent oxygen or moisture from penetrating into the organic light-emitting diodes 350 from the outside. The encapsulation layer 360 can be composed of a stack of multiple layers in which inorganic layers and organic layers are alternately stacked. However, the disclosure is not limited thereto.

Figure 8:
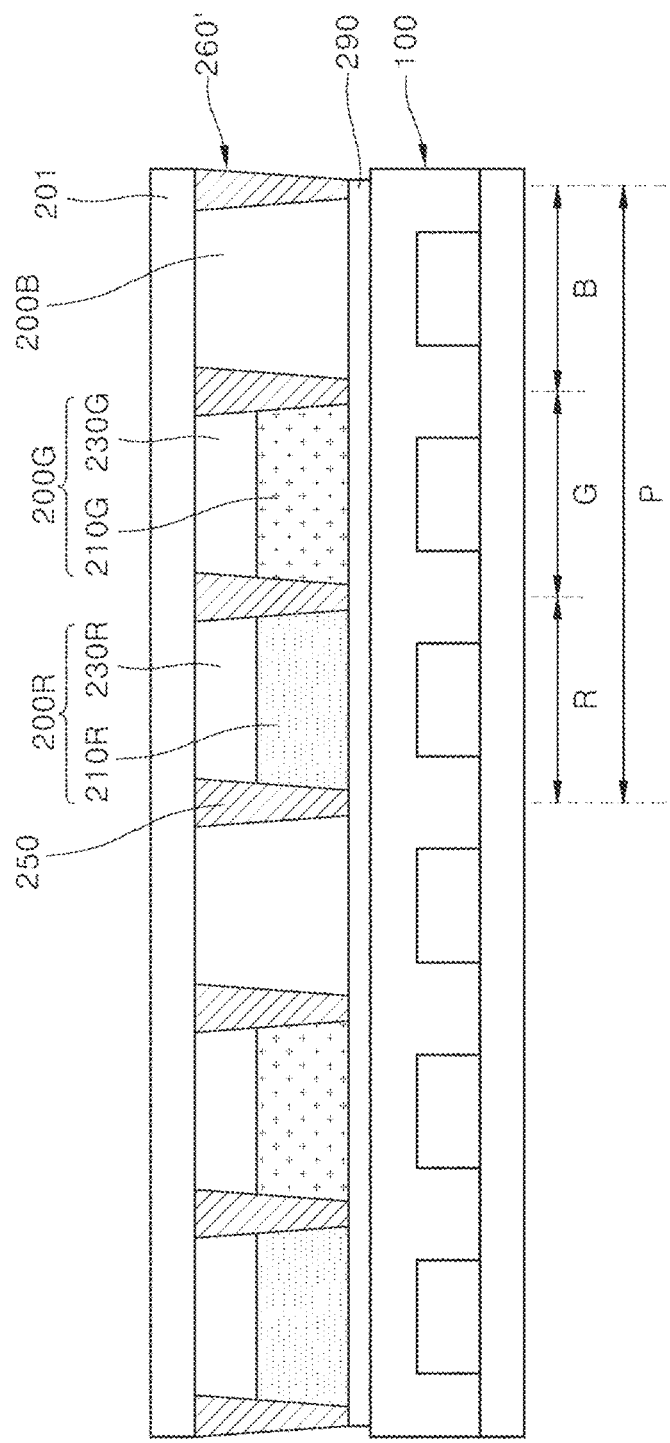
FIG. 8 is a drawing schematically showing a display device according to one embodiment of the present disclosure.

FIG. 8 is a drawing schematically showing a display device according to one embodiment of the present disclosure.

As shown in FIG. 8, the display device according to one embodiment of the present disclosure can include an array substrate 100 including light-emissive elements respectively arranged in a red sub-pixel area R, a green sub-pixel area G, and a blue sub-pixel area B, an adhesive layer 290 disposed on the array substrate 100, and a color filter substrate 260' disposed on the adhesive layer 290. The color filter substrate 260' can include a red color filter structure 200R disposed on the red sub-pixel area R of the array substrate 100, a green color filter structure 200G disposed on the green sub-pixel area G of the array substrate 100, and a blue color filter structure 200B disposed on the blue sub-pixel area B of the array substrate 100.

The red color filter structure 200R, the green color filter structure 200G, and the blue color filter structure 200B can be distinguished from each other by partition walls 250 respectively disposed at boundaries of the sub-pixel areas. The partition wall 250 can be embodied as a black matrix.

The display device shown in FIG. 8 can be manufactured in a different scheme from that of the display device shown in FIG. 2.

The color filter substrate 260' can be fabricated by a process separate from a formation process of the array substrate 100 and can be then bonded to the array substrate 100. The partition walls 250 defining the red, green, and blue sub-pixel areas can be formed on a base substrate 201. Then, the red color filter structure 200R, the green color filter structure 200G, and the blue color filter structure 200B can be respectively formed in the red, green, and blue sub-pixel areas defined by the partition wall 250. Thereby, the color filter structure 260' can be fabricated. Then, the color filter substrate 260' can be bonded to the array substrate 100 using the adhesive layer 290.

FIG. 16 is a cross-sectional view showing a color filter structure according to the comparative example.

As shown in FIG. 16, a color filter structure 500 according to the comparative example includes a light-conversion layer 510 including quantum dots 514 of the core/shell structure and scattering-particles 516 dispersed in a first resin, a low refractive index layer 520 stacked on the light-conversion layer 510, and a color filter layer 530 stacked on the low refractive index layer 520.

The quantum dot 514 can be the same as or similar to the quantum dot 214 in FIG. 1. The scattering-particle 516 can be the same as or similar to the scattering-particle 236 in FIG. 1.

The color filter layer 530 is composed of a second resin and pigments dispersed in the second resin. When the light emitted from the light-emissive element 10 is, for example, blue light, the pigment can be a red pigment or a green pigment.

The low refractive index layer 520 can be made of an organic or inorganic material having a refractive index lower than that of each of the first resin and the second resin. The low refractive index layer 520 can be made of the organic material, for example, fluorine resin, or of the inorganic material, for example, porous silica.

Embodiments of the present disclosure can be described as follows.

One aspect of the present disclosure provides a color filter structure for converting a wavelength of light emitted from a light-emissive element, the color filter structure including a light-conversion layer containing a first resin, and quantum dots dispersed in the first resin, wherein the quantum dot has a core/shell structure; and a light-absorbing layer stacked on the light-conversion layer, wherein the light-absorbing layer contains a second resin, and semiconductor nano-particles dispersed in the second resin, wherein the semiconductor nano-particles absorb light emitted from the light-emissive element.

In one implementation of the color filter structure, each of the semiconductor nano-particles is made of a group III-V compound semiconductor or a group II-VI compound semiconductor.

In one implementation of the color filter structure, each of the semiconductor nano-particles is made of $ZnSe_xTe_{1-x}$, where x is in a range of 0.72 to 0.9.

In one implementation of the color filter structure, each of the semiconductor nano-particles has a size in a range of 1 nm to 10 nm.

In one implementation of the color filter structure, the light-emissive element includes a micro light-emitting diode for emitting blue light or an organic light-emitting diode for emitting blue light, and each of the quantum dots includes a red quantum dot containing an InP core or a green quantum dot containing an InP core.

In one implementation of the color filter structure, refractive indexes of the first resin and the second resin are equal to each other.

In one implementation of the color filter structure, each of the first resin and the second resin includes an acrylic resin or an epoxy resin.

In one implementation of the color filter structure, the light-absorbing layer further contains scattering-particles dispersed in the second resin.

Another aspect of the present disclosure provides a display device including an array substrate including light-emissive elements respectively disposed in a red sub-pixel area, a green sub-pixel area, and a blue sub-pixel area; and a color filter layer including a red color filter structure disposed on the red sub-pixel area of the array substrate, and a green color filter structure disposed on the green sub-pixel area of the array substrate, wherein the red color filter structure includes a red light-conversion layer containing a first resin, and red quantum dots are dispersed in the first resin; and a first light-absorbing layer disposed on the red light-conversion layer, wherein the first light-absorbing layer contains a second resin, and semiconductor nano-particles dispersed in the second resin, wherein the semiconductor nano-particles absorb light emitted from the light-emissive elements, wherein the green color filter structure includes: a green light-conversion layer containing the first resin, and green quantum dots are dispersed in the first resin; and a second light-absorbing layer disposed on the green light-conversion layer, wherein the second light-absorbing layer contains the second resin, and semiconductor nano-particles dispersed in the second resin, wherein the semiconductor nano-particles absorb light emitted from the light-emissive elements.

In one implementation of the display device, each of the semiconductor nano-particles is made of a group III-V compound semiconductor or a group II-VI compound semiconductor.

In one implementation of the display device, each of the semiconductor nano-particles is made of $ZnSe_xTe_{1-x}$, where x is in a range of 0.72 to 0.9.

In one implementation of the display device, each of the semiconductor nano-particles has a size in a range of 1 nm to 10 nm.

In one implementation of the display device, the light-emissive element includes a micro light-emitting diode for emitting blue light or an organic light-emitting diode for emitting blue light, wherein each of the red and green quantum dots contains an InP core.

In one implementation of the display device, refractive indexes of the first resin and the second resin are equal to each other.

In one implementation of the display device, each of the first resin and the second resin includes an acrylic resin or an epoxy resin.

In one implementation of the display device, each of the first and second light-absorbing layers further contains scattering-particles dispersed in the second resin.

In one implementation of the display device, the color filter layer further includes a blue color filter structure disposed on the blue sub-pixel area of the array substrate, wherein a blue color filter structure contains a third resin, and scattering-particles dispersed in the third resin.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A color filter structure for converting a wavelength of light emitted from a light-emissive element, the color filter structure comprising:
   a light-conversion layer containing a first resin, and only quantum dots dispersed in the first resin, wherein each quantum dot has a core/shell structure; and
   a light-absorbing layer stacked on the light-conversion layer, wherein the light-absorbing layer contains a second resin, and semiconductor nano-particles dispersed in the second resin, wherein the semiconductor nano-particles absorb blue light emitted from the light-emissive element and do not exhibit photoluminescence characteristics, and wherein each of the semiconductor nano-particles is made of II-VI compound semiconductor $ZnSe_xTe_{1-x}$, where x is in a range of 0.72 to 0.9.

2. The color filter structure of claim 1, wherein each of the semiconductor nano-particles has a size in a range of approximately 1 nm to 10 nm.

3. The color filter structure of claim 1, wherein the light-emissive element includes a micro light-emitting diode for emitting blue light or an organic light-emitting diode for emitting blue light, and wherein each of the quantum dots includes a red quantum dot containing an InP core or a green quantum dot containing an InP core.

4. The color filter structure of claim 1, wherein refractive indexes of the first resin and the second resin are equal to each other.

5. The color filter structure of claim 4, wherein each of the first resin and the second resin includes an acrylic resin or an epoxy resin.

6. The color filter structure of claim 1, wherein the light-absorbing layer further contains scattering-particles dispersed in the second resin.

7. A display device comprising:
an array substrate including light-emissive elements respectively disposed in a red sub-pixel area, a green sub-pixel area, and a blue sub-pixel area; and
a color filter layer including a red color filter structure disposed on the red sub-pixel area of the array substrate, and a green color filter structure disposed on the green sub-pixel area of the array substrate,
wherein the red color filter structure includes:
a red light-conversion layer containing a first resin, and only red quantum dots dispersed in the first resin; and
a first light-absorbing layer disposed on the red light-conversion layer, wherein the first light-absorbing layer contains a second resin, and semiconductor nano-particles dispersed in the second resin, and the semiconductor nano-particles absorb blue light emitted from the light-emissive elements and do not exhibit photoluminescence characteristics, and
wherein the green color filter structure includes:

a green light-conversion layer containing the first resin, and only green quantum dots dispersed in the first resin of the green light-conversion layer;
a second light-absorbing layer disposed on the green light-conversion layer, wherein the second light-absorbing layer contains the second resin, and semiconductor nano-particles dispersed in the second resin of the second light-absorbing layer, and the semiconductor nano-particles of the second light-absorbing layer absorb blue light emitted from the light-emissive elements and do not exhibit photoluminescence characteristics, and
wherein each of the semiconductor nano-particles is made of II-VI compound semiconductor $ZnSe_xTe_{1-x}$, where x is in a range of 0.72 to 0.9.

8. The display device of claim 7, wherein each of the semiconductor nano-particles has a size in a range of approximately 1 nm to 10 nm.

9. The display device of claim 7, wherein each of the light-emissive elements includes a micro light-emitting diode for emitting blue light or an organic light-emitting diode for emitting blue light, and wherein each of the red and green quantum dots contains an InP core.

10. The display device of claim 7, wherein refractive indexes of the first resin and the second resin are equal to each other.

11. The display device of claim 10, wherein each of the first resin and the second resin includes an acrylic resin or an epoxy resin.

12. The display device of claim 7, wherein each of the first and second light-absorbing layers further contains scattering-particles dispersed in the second resin.

13. The display device of claim 7, wherein the color filter layer further includes a blue color filter structure disposed on the blue sub-pixel area of the array substrate, and wherein the blue color filter structure contains a third resin, and scattering-particles dispersed in the third resin.

14. The color filter structure of claim 1, wherein a thickness of the light-absorbing layer is approximately 2 μm to 4 μm.

15. The display device of claim 7, wherein a thickness of the first light-absorbing layer or the second light-absorbing layer is approximately 2 μm to 4 μm.

* * * * *